(12) United States Patent
Nishio

(10) Patent No.: US 12,031,685 B2
(45) Date of Patent: Jul. 9, 2024

(54) METHOD AND SUPPLY EQUIPMENT FOR SUPPLYING FLUORINE GAS-CONTAINING GAS

(71) Applicant: SHOWA DENKO K.K., Tokyo (JP)

(72) Inventor: Yuya Nishio, Tokyo (JP)

(73) Assignee: Resonac Corporation, Tokyo (JP)

( * ) Notice: Subject to any disclaimer, the term of this patent is extended or adjusted under 35 U.S.C. 154(b) by 624 days.

(21) Appl. No.: 17/270,679

(22) PCT Filed: Jul. 30, 2019

(86) PCT No.: PCT/JP2019/029860
§ 371 (c)(1),
(2) Date: Feb. 23, 2021

(87) PCT Pub. No.: WO2020/049900
PCT Pub. Date: Mar. 12, 2020

(65) Prior Publication Data
US 2021/0341103 A1    Nov. 4, 2021

(30) Foreign Application Priority Data

Sep. 3, 2018   (JP) .................................. 2018-164701

(51) Int. Cl.
*F17C 7/00* (2006.01)
*H01L 21/67* (2006.01)

(52) U.S. Cl.
CPC ........ *F17C 7/00* (2013.01); *F17C 2205/0323* (2013.01); *F17C 2205/0338* (2013.01);
(Continued)

(58) Field of Classification Search
CPC ................ F17C 7/00; F17C 2205/0323; F17C 2205/0338; F17C 2205/0352; F17C 2221/01; F17C 2227/044; H01L 21/67017
See application file for complete search history.

(56) References Cited

U.S. PATENT DOCUMENTS 5,704,967 A  *  1/1998  Tom .................. B01D 53/0407
                                                 96/147
5,707,424 A  *  1/1998  Tom .................. B01D 53/0407
                                                 95/902
(Continued)

FOREIGN PATENT DOCUMENTS

CN       201923845 U      8/2011
CN       103511829 A      1/2014
(Continued)

OTHER PUBLICATIONS

International Search Report for PCT/JP2019/029860 dated Sep. 10, 2019 (PCT/ISA/210).
(Continued)

*Primary Examiner* — Timothy L Maust
(74) *Attorney, Agent, or Firm* — Sughrue Mion, PLLC

(57) ABSTRACT

A method supply equipment for supplying a fluorine gas-containing gas which includes a sealing step of introducing a second fluorine gas-containing gas having a fluorine gas concentration in a range of ±10% of that of a first fluorine gas-containing gas into a portion between a container valve (3) and a pressure regulator (7) of a pipe (4) such that a pressure is lower than the gas pressure in a filled container (2). After the sealing step, a buffer tank (9) is brought into an opened state, and then the first fluorine gas-containing gas is supplied from the filled container (2) to the portion between the container valve (3) and the pressure regulator (7) of the pipe (4). Thereafter, the pressure regulator (7) is brought into an opened state, and then the first fluorine gas-containing gas is supplied to consumption equipment (20) while regulating a pressure by the pressure regulator (7).

19 Claims, 1 Drawing Sheet

(52) U.S. Cl.
CPC .. *F17C 2205/0352* (2013.01); *F17C 2221/01* (2013.01); *F17C 2227/044* (2013.01); *F17C 2270/0518* (2013.01); *H01L 21/67017* (2013.01)

(56) References Cited

U.S. PATENT DOCUMENTS

| | | | | |
|---|---|---|---|---|
| 6,907,740 | B2* | 6/2005 | Tom | F17C 5/06 62/48.1 |
| 7,150,299 | B2* | 12/2006 | Hertzler | F17C 13/04 141/2 |
| 8,261,762 | B2* | 9/2012 | Komiyama | F17C 7/00 137/15.04 |
| 10,220,928 | B2 | 3/2019 | Oka | |
| 10,823,336 | B2* | 11/2020 | Ouerd | F17C 7/04 |
| 2007/0204631 | A1* | 9/2007 | Udischas | F17C 9/02 62/50.2 |
| 2009/0170332 | A1* | 7/2009 | Komiyama | F17C 7/00 438/758 |
| 2010/0059694 | A1* | 3/2010 | Olander | F17C 13/04 137/488 |
| 2013/0008781 | A1* | 1/2013 | Kikuchi | C25B 15/08 204/247 |
| 2013/0012027 | A1* | 1/2013 | Paganin | C25B 1/245 134/1.2 |
| 2015/0040856 | A1 | 2/2015 | Oka | |
| 2018/0371611 | A1* | 12/2018 | Sato | C23C 16/45563 |
| 2020/0345881 | A1* | 11/2020 | Yoshimoto | A61L 2/204 |
| 2021/0341103 | A1* | 11/2021 | Nishio | F17C 7/00 |

FOREIGN PATENT DOCUMENTS

| | | |
|---|---|---|
| JP | 2006-144950 A | 6/2006 |
| JP | 2007-107904 A | 4/2007 |
| JP | 2007-255666 A | 10/2007 |
| JP | 2011-140680 A | 7/2011 |
| JP | 2012-154429 A | 8/2012 |
| JP | 2012-167813 A | 9/2012 |
| JP | 2013-209926 A | 10/2013 |
| JP | 2015-212558 A | 11/2015 |
| WO | 2006/043125 A1 | 4/2006 |

OTHER PUBLICATIONS

International Preliminary Report on Patentability dated Mar. 9, 2021, with translation of the Written Opinion from the International Bureau in International Application No. PCT/JP2019/029860.
Translation of Office Action dated Jan. 10, 2022 from the China National Intellectual Property Administration in CN Application No. 201980056969.1.
Extended European Search Report dated Oct. 14, 2021 from the European Patent Office in corresponding EP Application No. 19857812. 2.

* cited by examiner

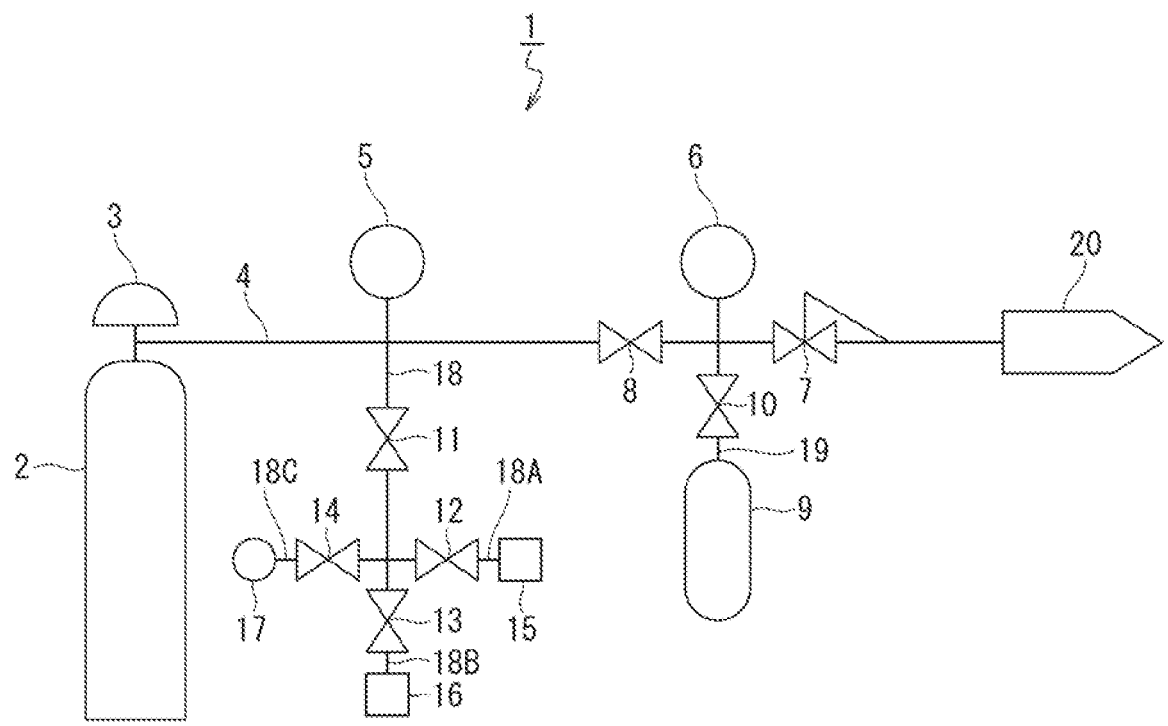

METHOD AND SUPPLY EQUIPMENT FOR SUPPLYING FLUORINE GAS-CONTAINING GAS

CROSS REFERENCE TO RELATED APPLICATIONS

This application is a National Stage of International Application No. PCT/JP2019/029860 filed Jul. 30, 2019, claiming priority based on Japanese Patent Application No. 2018-164701 filed Sep. 3, 2018.

TECHNICAL FIELD

The present invention relates to a method and supply equipment for supplying a fluorine gas-containing gas.

BACKGROUND ART

A fluorine gas-containing gas is used as a cleaning gas for semiconductor manufacturing devices. In equipment, for supplying the cleaning gas, in order to prevent the leakage of the cleaning gas from connection portions of instruments or pipes, the connection portions are sealed by seal materials formed of resin materials having good shape followability. However, when a high pressure gas is supplied to consumption equipment through a pipe from a container filled with the gas at a high pressure, there has been a risk that the seal material is thermally deformed, eroded, or damaged by fire by the generation of heat caused by the adiabatic compression and shock waves when the high pressure gas is introduced into the pipe from the container.

Thus, in order to prevent the seal material from being thermally deformed, eroded, or damaged by fire, gas supply methods have been proposed which include supplying a high pressure gas to consumption equipment through a shock wave attenuation mechanism from a container filled with the gas at a high pressure (see PTLS 1 and 2).

According to the gas supply methods disclosed in PTLS 1 and 2, although the thermal deformation or the like of the seal material can be prevented, the shock wave attenuation mechanism is required. Therefore, there have been risks that the device configuration in equipment for supplying a cleaning gas is complicated and the cleaning gas cannot be supplied at a sufficient flow rate to the consumption equipment.

PTL 3 has proposed a gas supply method including decompressing a fluorine gas-containing gas filling a container at a high pressure with a decompression device, and then supplying the decompressed gas to consumption equipment. The gas supply method disclosed in PTL 3 includes performing a filling and sealing step of filling a pipe letting a container valve of the container and the decompression device communicate with each other with an inert gas having a pressure higher than the supply pressure to the consumption equipment and lower than the filling pressure of the container, and, after the filling and sealing step, supplying the fluorine gas-containing gas to the consumption equipment from the container through the pipe.

According to the gas supply method disclosed in PTL 3, the device configuration of equipment for supplying a cleaning gas is not complicated and the cleaning gas can be supplied at a sufficient flow rate to the consumption equipment.

CITATION LIST

Patent Literature

PTL 1: JP 2012-154429 A
PTL 2: JP 2012-167813 A
PTL 3: JP 2015-212558 A

SUMMARY OF INVENTION

Technical Problem

However, the gas supply method disclosed in PTL 3 has had a problem that the fluorine gas concentration of the fluorine gas-containing gas decreases by an inert gas. Further, a large number of valves and filters are passed until the fluorine gas-containing gas is supplied to the consumption equipment from the container, so that the frequency of the occurrence of the generation of heat due to the adiabatic compression and the shock waves increases, and therefore there has been a risk that the thermal deformation, erosion, or damage by firing of the sealing material cannot be sufficiently suppressed.

It is an object of the present invention to provide a method and supply equipment for supplying a fluorine gas-containing gas which does not complicate the device configuration of the supply equipment for supplying a fluorine gas-containing gas and which can suppress the thermal deformation, erosion, or damage by firing of a member formed of a resin material used in the supply equipment for supplying a fluorine gas-containing gas and can supply the fluorine gas-containing gas at a sufficient flow rate without reducing the fluorine gas concentration of the fluorine gas-containing gas.

Solution to Problem

In order to solve the above-described problems, one aspect of the present invention is as described in [1] to [8] below.

[1] A method for supplying a fluorine gas-containing gas from supply equipment for supplying the fluorine gas-containing gas to consumption equipment consuming the fluorine gas-containing gas, in which the supply equipment includes a filled container filled with a first fluorine gas-containing gas, a pipe letting a container valve of the filled container and the consumption equipment communicate with each other, a pressure regulator provided on the pipe and passing the gas from the upstream side to the downstream side while regulating a gas pressure, and a buffer tank connected to a portion on the upstream side relative to the pressure regulator of the pipe, the method includes performing a sealing step of bringing the pressure regulator into a closed state, and then introducing a second fluorine gas-containing gas having a fluorine gas concentration in a range of ±10% of a fluorine gas concentration of the first fluorine gas-containing gas into a portion between the container valve and the pressure regulator of the pipe such that a pressure is lower than the gas pressure in the filled container, and, after the sealing step, in a state where the second fluorine gas-containing gas is sealed in the portion between the container valve and the pressure regulator of the pipe and after the buffer tank is brought into an opened state, introducing the first fluorine gas-containing gas from the filled container into the portion between the container valve and the pressure regulator of the pipe, bringing the pressure regulator into an opened state, and then supplying the first fluorine gas-containing gas to the consumption equipment while regulating a pressure by the pressure regulator.

[2] The method for supplying a fluorine gas-containing gas according to [1], in which the pressure of the second fluorine gas-containing gas is 45% or more and 54% or less of the gas pressure in the filled container.

[3] The method for supplying a fluorine gas-containing gas according to [1], in which, as the second fluorine gas-containing gas, a fluorine gas-containing gas having the same pressure and fluorine gas concentration as those of the first fluorine gas-containing gas is used.

[4] The method for supplying a fluorine gas-containing gas according to any one of [1] to [3], in which a gate valve used in the supply equipment is a diaphragm valve.

[5] The method for supplying a fluorine gas-containing gas according to any one of [1] to [4] includes, before the sealing step, performing a purge treatment step of replacing the portion between the container valve and the pressure regulator of the pipe with an inert gas.

[6] The method for supplying a fluorine gas-containing gas according to any one of [1] to [5], in which a material of a seat as a constituent component of the pressure regulator is a polychlorotrifluoroethylene resin.

[7] The method for supplying a fluorine gas-containing gas according to any one of [1] to [6], in which the consumption equipment is a semiconductor manufacturing device.

[8] Supply equipment for supplying a fluorine gas-containing gas to consumption equipment consuming the fluorine gas-containing gas includes a filled container filled with a first fluorine gas-containing gas, a pipe letting a container valve of the filled container and the consumption equipment communicate with each other, a pressure regulator provided on the pipe and passing the gas from the upstream side to the downstream side while regulating the gas pressure, and a buffer tank connected to a portion on the upstream side relative to the pressure regulator of the pipe, in which the volume of the buffer tank is 0.21% or more and 10% or less of the volume of the filled container.

Advantageous Effects of Invention

The present invention does not complicate the device configuration of supply equipment for supplying a fluorine gas-containing gas, can suppress the thermal deformation, erosion, or damage by fire of a member formed of a resin material used in the supply equipment for supplying a fluorine gas-containing gas, and can supply the fluorine gas-containing gas at a sufficient flow rate without reducing the fluorine gas concentration of the fluorine gas-containing gas.

BRIEF DESCRIPTION OF DRAWINGS

The FIGURE is a schematic view of supply equipment for supplying a fluorine gas-containing gas for explaining one embodiment of a method for supplying a fluorine gas-containing gas according to the present invention.

DESCRIPTION OF EMBODIMENTS

One embodiment of the present invention will now be described. This embodiment describes an example of the present invention and the present invention is not limited to this embodiment. Further, this embodiment can be variously altered or modified and embodiments obtained by such alternations or modifications may also be included in the present invention.

A method for supplying a fluorine gas-containing gas of this embodiment is a method for supplying a fluorine gas-containing gas from fluorine gas-containing gas supply equipment 1 to consumption equipment 20 consuming the fluorine gas-containing gas. Hereinafter, an example of the configuration of the fluorine gas-containing gas supply equipment 1 is described referring to the FIGURE.

The fluorine gas-containing gas supply equipment 1 illustrated in the FIGURE includes a filled container 2 filled with a first fluorine gas-containing gas, a pipe 4 letting a container valve 3 of the filled container 2 and the consumption equipment 20 communicate with each other, a pressure regulator 7 provided on the pipe 4 and passing the gas pass from the upstream side to the downstream side while regulating a gas pressure, and a buffer tank 9 connected to a portion on the upstream side relative to the pressure regulator 7 of the pipe 4.

The configuration of the supply equipment 1 is described in more detail. On the pipe 4, a first pressure gauge 5, a first gate valve 8, a second pressure gauge 6, and the pressure regulator 7 are provided in this order from the upstream side. The pressure in the pipe 4 can be measured by the first pressure gauge 5 and the second pressure gauge 6. Further, from a portion between the pressure regulator 7 and the first gate valve 8 of the pipe 4, a second branch pipe 19 is branched. The buffer tank 9 is connected to a downstream side end portion of the second branch pipe 19. On the second branch pipe 19, a second gate valve 10 is provided. By opening/closing the second gate valve 10, the buffer tank 9 can be controlled into an opened state or a closed state.

Further, from a portion between the container valve 3 and the first gate valve 8 of the pipe 4, a first branch pipe 18 is branched. Three branch pipes 18A, 18B, 18C are further branched from a downstream side end portion of the first branch pipe 18. Toa downstream side end portion of the branch pipe 18A, an inert gas supply source 15 is connected. To a downstream side end portion of the branch pipe 18B, a second fluorine gas-containing gas supply source 16 is connected. To a downstream side end portion of the branch pipe 18C, a vacuum pump 17 is connected. On the first branch pipe 18 and the three branch pipes 18A, 18B, 18C, a third gate valve 11, a fourth gate valve 12, a fifth gate valve 13, and a sixth gate valve 14 are provided, respectively.

Although fluorine gas is also usable as the first fluorine gas-containing gas and the second fluorine gas-containing gas, a mixed gas obtained by diluting fluorine gas with an inert gas is also usable. Examples of the inert gas include nitrogen gas, helium, argon, and the like and nitrogen gas is preferable. One or two or more types of gas may be used for diluting fluorine gas. The content of the fluorine gas in the first fluorine gas-containing gas and the second fluorine gas-containing gas is preferably 10% by volume or more and 30% by volume or less and more preferably 20% by volume or more and 22% by volume or less.

Next, a method for supplying the fluorine gas-containing gas to the consumption equipment 20 using the supply equipment 1 of the FIGURE is described. Table 1 collectively illustrates the opened/closed states of the valves 3, 8, 10, 11, 12, 13, 14 and the pressure regulator 7 in each step when the fluorine gas-containing gas is supplied to the consumption equipment 20 using the supply equipment 1.

The valves 3, 8, 10, 11, 12, 13, 14 and the pressure regulator 7 are all in the closed state at the start.

First, before the fluorine gas-containing gas is supplied to the consumption equipment 20, a purge treatment step is preferably performed from the viewpoint of the removal of impurities. By bringing the container valve 3 of the filled container 2, the fourth gate valve 12, the fifth gate valve 13, the sixth gate valve 14, and the pressure regulator 7 into the closed state and bringing the first gate valve 8, the second gate valve 10, and the third gate valve 11 into the opened state, a portion between the container valve 3 and the pressure regulator 7 of the pipe 4 (hereinafter also sometimes referred to as "upstream side portion of the pipe 4"), the buffer tank 9, the inert gas supply source 15, the second fluorine gas-containing gas supply source 16, and the vacuum pump 17 are all brought into a communicable state.

TABLE 1

|  | Container valve 3 | Third gate valve 1 | Fourth gate valve 12 | Fifth gate valve 13 | Sixth gate valve 14 | First gate valve 8 | Second gate valve 10 | Pressure regulator 7 |
|---|---|---|---|---|---|---|---|---|
| Step 1 | Closed | Opened | Opened | Closed | Closed | Opened | Opened | Closed |
| Step 2 | Closed | Opened | Closed | Closed | Opened | Opened | Opened | Closed |
| Step 3 | Closed | Opened | Closed | Opened | Closed | Opened | Opened | Closed |
| Step 4 | Closed | Opened | Closed | Closed | Opened | Opened | Opened | Closed |
| Step 5 | Closed | Opened | Closed | Opened | Closed | Opened | Opened | Closed |
| Step 6 | Closed | Opened | Closed | Closed | Closed | Opened | Opened | Closed |
| Step 7 | Closed | Closed | Closed | Closed | Closed | Closed | Closed | Closed |
| Step 8 | Opened | Closed | Closed | Closed | Closed | Closed | Closed | Closed |
| Step 9 | Opened | Closed | Closed | Closed | Closed | Opened | Opened | Closed |
| Step 10 | Opened | Closed | Closed | Closed | Closed | Opened | Closed | Opened |

Next, the fourth gate valve 12 is brought into the opened state, and then an inert gas is introduced into the upstream side portion of the pipe 4 and the buffer tank 9 from the inert gas supply source 15 (Step 1). Although the type of the inert gas is not particularly limited, nitrogen gas, helium, and argon are preferable, for example, and nitrogen gas is more preferable. Nitrogen gas is inexpensive and available in large quantities, and therefore is economically advantageous. When the inert gas is introduced, the fourth gate valve 12 is brought into the closed state and the sixth gate valve 14 is brought into the opened state, and then the introduced inert gas is exhausted by the vacuum pump 17 (Step 2). By repeating the above-described operations of introducing and exhausting the inert gas two or more times, the air present in the upstream side portion of the pipe 4 and the buffer tank 9 is replaced with the inert gas. When the replacement with the inert gas is completed, the fourth gate valve 12 and the sixth gate valve 14 are brought into the closed state.

Successively, the fifth gate valve 13 is brought into the opened state, and then the second fluorine gas-containing gas is introduced into the upstream side portion of the pipe 4 and the buffer tank 9 from the second fluorine gas-containing gas supply source 16 (Step 3). The second fluorine gas-containing gas is a fluorine gas-containing gas having a pressure lower than the gas pressure in the filled container 2 and a fluorine gas concentration in a range of ±10% of a fluorine gas concentration of the first fluorine gas-containing gas. Gas other than the fluorine gas in the second fluorine gas-containing gas is an inert gas.

When the second fluorine gas-containing gas is introduced, the fifth gate valve 13 is brought into the closed state and the sixth gate valve 14 is brought into the opened state, and then the introduced second fluorine gas-containing gas is exhausted by the vacuum pump 17 (Step 4). By repeating the above-described operations of introducing and exhausting the second fluorine gas-containing gas two or more times, the inert gas present in the upstream side portion of the pipe 4 and the buffer tank 9 is replaced with the second fluorine gas-containing gas. When the replacement with the second fluorine gas-containing gas is completed, the fifth gate valve 13 and the sixth gate valve 14 are brought into the closed state. Thus, the purge treatment step is completed.

When the purge treatment step is completed, a sealing step is performed which introduces and encloses the second fluorine gas-containing gas into the upstream side portion of the pipe 4. More specifically, the fifth gate valve 13 is brought into the opened state, and then the second fluorine gas-containing gas is introduced into the upstream side portion of the pipe 4 and the buffer tank 9 from the second fluorine gas-containing gas supply source 16 (Step 5). When measured values obtained by the first pressure gauge 5 and the second pressure gauge 6 reach a predetermined pressure, the fifth gate valve 13 is brought into the closed state. Thus, the sealing of the second fluorine gas-containing gas in the upstream side portion of the pipe 4 and the buffer tank 9 is completed (Step 6).

The pressure of the second fluorine gas-containing gas used for the sealing step is set to a pressure lower than the gas pressure of the first fluorine gas-containing gas in the filled container 2 and is preferably set to 20% or more and 80% or less, more preferably set to 30% or more and 70% or less, and still more preferably set to 45% or more and 54% or less of the gas pressure of the first fluorine gas-containing gas in the filled container 2. The pressure in such ranges above is advantageous from the viewpoint of reducing the adiabatic compression and shock waves.

In the sealing step, the pressure of the second fluorine gas-containing gas supply source 16 may be set to be lower than the pressure in the container of the filled container 2 in advance. However, even when the pressure of the second fluorine gas-containing gas supply source 16 is conversely higher, the second fluorine gas-containing gas can be sealed by completing the sealing step when the measured value of the second pressure gauge 6 reaches a pressure set to be lower than the pressure in the container of the filled container 2.

As the second fluorine gas-containing gas, a fluorine gas-containing gas having the same pressure and fluorine gas concentration as those of the first fluorine gas-containing gas is also usable. For example, when the filled container 2 is used as the second fluorine gas-containing gas supply source 16 in the sealing step, the first fluorine gas-containing gas is usable as the second fluorine gas-containing gas. Further, the second fluorine gas-containing gas supply source 16 containing the same fluorine gas-containing gas as the first fluorine gas-containing gas as the second fluorine gas-containing gas may be used.

The gas pressure in the upstream side portion of the pipe 4 after the sealing step is completed is not particularly limited and is preferably set to 120% or more and 200% or less, more preferably set to 130% or more and 170% or less, and still more preferably set to 140% or more and 160% or less of the supply pressure power to the consumption equipment 20.

When the sealing of the second fluorine gas-containing gas is completed, the first gate valve 8, the second gate valve 10, and the third gate valve 11 are brought into the closed state (Step 7). In the sealing step, the second fluorine gas-containing gas may not be introduced into the buffer tank 9 by bringing the second gate valve 10 into the closed state, and then introducing the second fluorine gas-containing gas.

When the sealing step is completed, the container valve 3 is brought into the opened state (the second gate valve 10 is in the closed state), and then the first fluorine gas-containing gas filling the filled container 2 at a high pressure is introduced into the portion between the container valve 3 and the first gate valve 8 of the pipe 4 (Step 8). When the first fluorine gas-containing gas is introduced, the portion between the container valve 3 and the first gate valve 8 of the pipe 4 is maintained in the state where the second fluorine gas-containing gas is sealed, and then the first fluorine gas-containing gas is introduced into the pipe 4 in which the second fluorine gas-containing gas is sealed.

Successively, by bringing the second gate valve 10 into the opened state, and then bringing the first gate valve 8 into the opened state, the fluorine gas-containing gas sealed in the portion between the container valve 3 and the first gate valve 8 of the pipe 4 is introduced into a portion between the first gate valve 8 and the pressure regulator 7 of the pipe 4 and the buffer tank 9 (Step 9). Since the second fluorine gas-containing gas is mainly sent to the buffer tank 9, the fluorine gas-containing gas in the upstream side portion of the pipe 4 is the first fluorine gas-containing gas.

When it is confirmed that the measured values obtained by the first pressure gauge 5 and the second pressure gauge 6 reach the same value, the second gate valve 10 is brought into the closed state and the pressure regulator 7 is operated into the opened state (Step 10). Thus, the first fluorine gas-containing gas filling the filled container 2 at a high pressure can be supplied to the consumption equipment 20 of a semiconductor manufacturing device or the like while regulating the pressure (decompression) by the pressure regulator 7. The second gate valve 10 may be brought into the opened state at this time. The supply pressure of the fluorine gas-containing gas to the consumption equipment 20 is preferably set to 1% or more and 50% or less, more preferably set to 5% or more and 40% or less, and still more preferably set to 10% or more and 25% or less of the gas pressure in the filled container 2.

The method for supplying a fluorine gas-containing gas in this embodiment described above can suppress the thermal deformation, erosion, or damage by fire of a member formed of a resin material used in supply equipment for supplying a fluorine gas-containing gas. For example, even when seal materials sealing connection portions of instruments or pipes or seats as constituent components of pressure regulators and valves are formed of resin materials, the thermal deformation, erosion, or damage by fire is hard to occur. The type of the resin material is not particularly limited and fluororesin, such as a polychlorotrifluoroethylene resin, is mentioned, for example.

The seats as the constituent components of the pressure regulators and the valves are members for controlling the gas flow by being combined with stems. More specifically, when the stem is pressed against the seat in the pressure regulator or the valve, so that a gap between the stem and the seat is eliminated, the gas flow is blocked. When the stem is separated from the seat, the gas flows through the gap between the stem and the seat.

Further, in this embodiment, there is no necessity of providing a shock wave attenuation mechanism for preventing the seal materials or the seats from being thermally deformed, eroded, or damaged by fire, and therefore the device configuration of the supply equipment for supplying a fluorine gas-containing gas is not complicated. The method for supplying a fluorine gas-containing gas of this embodiment can reduce the adiabatic compression and the shock waves in a gas flow passage when the gas is supplied by sealing the second fluorine gas-containing gas having a pressure higher than the supply pressure to the consumption equipment 20 and a pressure lower than the gas pressure in the filled container 2 and further having almost the same fluorine gas concentration as that of the first fluorine gas-containing gas in the upstream side portion of the pipe 4, and therefore can suppress the thermal deformation, erosion, or damage by fire of the member formed of the resin material.

Further, according to the method for supplying a fluorine gas-containing gas of this embodiment, an inert gas is not sealed in the pipe 4 and the second fluorine gas-containing gas is sealed in the pipe 4 in the sealing step. Therefore, the fluorine gas-containing gas can be supplied at a sufficient flow rate to the consumption equipment 20 without reducing the fluorine gas concentration of the fluorine gas-containing gas.

Further, the mixing of impurities into the system can be suppressed by performing the purge treatment step before the sealing step as described above. Further, the necessity of using an excess inert gas in the purge treatment step is eliminated by setting the pressure of the second fluorine gas-containing gas used for the sealing step to 45% or more and 54% or less of the gas pressure of the first fluorine gas-containing gas in the filled container 2. Therefore, the fluorine gas-containing gas can be supplied without reducing the fluorine gas concentration.

In this embodiment, the buffer tank 9 is installed on the upstream side of the pressure regulator 7. The volume of the buffer tank 9 is preferably set to 0.1% or more and 10% or less, more preferably set to 0.5% or more and 5% or less, and still more preferably set to 1% or more and 3% or less of the volume of the filled container 2. When the volume is in such ranges above, the pressure regulation is facilitated and a pressure loss of the filled container 2 is hard to occur when the first fluorine gas-containing gas is introduced into the pipe 4 from the filled container 2.

In the supply equipment 1, a diaphragm valve is usable as the gate valve, such as the first gate valve 8. A diaphragm type gate valve has a structure in which gas is hard to leak to the outside, and therefore is frequently used in a case of a corrosive gas. However, the diaphragm type gate valve is difficult to be finely regulated in the opening of the valve, and therefore is likely to cause the adiabatic compression and the shock waves. Thus, by providing the buffer tank 9 on the upstream side of the pressure regulator 7, a pressure increase in the first gate valve 8 can be finely regulated, and therefore the adiabatic compression and the shock waves can be sharply reduced. As a result, the diaphragm valve is easily used as the gate valve, such as the first gate valve 8.

The present invention is described in more detail by giving Examples and Comparative Examples.

Example 1

A fluorine gas-containing gas was supplied to consumption equipment using equipment similar to the supply equipment 1 in the FIGURE in the same manner as described above. A detailed description is given referring to the FIGURE.

The filled container 2 having a 5 L volume filled with a fluorine gas-containing gas (first fluorine gas-containing gas) at a gas pressure of 14 MPa was prepared. The first fluorine gas-containing gas was obtained by diluting fluorine gas with nitrogen gas such that the fluorine gas concentration was 20% by volume. Further, the second fluorine gas-containing gas supply source 16 containing a fluorine gas-containing gas having the same composition as that of the first fluorine gas-containing gas as the second fluorine gas-containing gas was prepared.

For the first gate valve 8 and the pressure regulator 7, those in which a material of seats as constituent components thereof is a polychlorotrifluoroethylene resin were used.

The filling pressure of filling the pipe 4 with the second fluorine gas-containing gas in the sealing step after the purge treatment step was set to 7 MPa, which was 50% of the gas pressure in the filled container 2. The volume of the buffer tank 9 was set to 50 mL, which was 1% of the volume of the filled container 2.

From the initial state in which all the valves are in the closed state, the first gate valve 8, the second gate valve 10, the third gate valve 11, and the fourth gate valve 12 were brought into the opened state, and then the nitrogen gas was introduced into the upstream side portion of the pipe 4 and the buffer tank 9 from the inert gas supply source 15. When the introduction of the nitrogen gas was completed, the fourth gate valve 12 was brought into the closed state and the sixth gate valve 14 was brought into the opened state, and then the upstream side portion of the pipe 4 and the buffer tank 9 were sucked by the vacuum pump 17, whereby the nitrogen gas was exhausted. When the exhaust of the nitrogen gas was completed, the sixth gate valve 14 was brought into the closed state. By repeating the above-described operations of introducing and exhausting the nitrogen gas 5 times, the upstream side portion of the pipe 4 and the buffer tank 9 were replaced with the nitrogen gas.

Successively, the fifth gate valve 13 was brought into the opened state, and then the second fluorine gas-containing gas was introduced into the upstream side portion of the pipe 4 and the buffer tank 9 from the second fluorine gas-containing gas supply source 16. When the introduction of the second fluorine gas-containing gas was completed, the fifth gate valve 13 was brought into the closed state and the sixth gate valve 14 was brought into the opened state, and then the upstream side portion of the pipe 4 and the buffer tank 9 were sucked by the vacuum pump 17, whereby the second fluorine gas-containing gas was exhausted. When the exhaust of the second fluorine gas-containing gas was completed, the sixth gate valve 14 was brought into the closed state. By repeating the above-described operations of introducing and exhausting the second fluorine gas-containing gas 5 times, the upstream side portion of the pipe 4 and the buffer tank 9 were replaced with the second fluorine gas-containing gas.

After such a purge treatment step was completed, the fifth gate valve 13 was brought into the opened state, and then the second fluorine gas-containing gas was introduced into the upstream side portion of the pipe 4 and the buffer tank 9 from the second fluorine gas-containing gas supply source 16. When the measured value of the first pressure gauge 5 reached 7 MPa, the fifth gate valve 13 was brought into the closed state, and then the second fluorine gas-containing gas was sealed in the upstream side portion of the pipe 4 and the buffer tank 9 (sealing step).

Next, the first gate valve 8, the second gate valve 10, and the third gate valve 11 were brought into the closed state and the container valve 3 was brought into the opened state, and then the first fluorine gas-containing gas was introduced into the portion between the container valve 3 and the first gate valve 8 of the pipe 4 from the filled container 2. When the measured value of the first pressure gauge 5 reached 14 MPa, the second gate valve 10 was brought into the opened state and the first gate valve 8 was successively brought into the opened state, and then the first fluorine gas-containing gas was slowly introduced into the upstream side portion of the pipe 4 and the buffer tank 9.

When the measured value of the second pressure gauge 6 reached 14 MPa similarly to the first pressure gauge 5, the second gate valve 10 was brought into the closed state. Then, the pressure regulator 7 was brought into the opened state, and then the first fluorine gas-containing gas was supplied to the consumption equipment 20 while regulating the supply pressure to the consumption equipment 20 to 10% (1.4 MPa) of the gas pressure in the filled container 2. In the consumption equipment 20, the gas amount of the first fluorine gas-containing gas supplied to the consumption equipment 20 was measured.

Each time when 10 L of the first fluorine gas-containing gas was supplied to the consumption equipment 20, a seat leakage test for the first gate valve 8 and the pressure regulator 7 was carried out using helium gas having a pressure of 14 MPa (such that the measured value of the second pressure gauge 6 reached 14 MPa). The seat leakage refers to the leakage of gas due to the thermal deformation, erosion, damage by fire, or the like of the seat as a constituent component. As a result, the seat leakage was not observed even after 200 L of the first fluorine gas-containing gas was supplied to the consumption equipment 20.

Example 2

Until the purge treatment step, the same operations as those in Example 1 were performed. Thereafter, the third gate valve 11 was brought into the closed state and the first gate valve 8, the second gate valve 10, and the container valve 3 were brought into the opened state, and then the first fluorine gas-containing gas in the filled container 2 was introduced into the upstream side portion of the pipe 4 and the buffer tank 9. At that time, the first fluorine gas-containing gas was introduced over 10 seconds until the measured value of the second pressure gauge 6 reached 7 MPa and the first fluorine gas-containing gas was successively further introduced over 10 seconds until the measured value of the second pressure gauge 6 reached 14 MPa. Thus, the sealing step and the subsequent introduction of the first fluorine gas-containing gas into the upstream side portion of the pipe 4 from the filled container 2 were continuously performed.

Next, the second gate valve 10 was brought into the closed state and the pressure regulator 7 was brought into the opened state, and then the first fluorine gas-containing gas was supplied to the consumption equipment 20 while regulating the supply pressure to the consumption equipment 20 to 10% (1.4 MPa) of the gas pressure in the filled container 2.

After the above-described operations were carried out 100 times, a seat leakage test for the first gate valve 8 and the pressure regulator 7 was carried out using helium gas having a pressure of 14 MPa (such that the measured value of the second pressure gauge 6 reached 14 MPa). As a result, the seat leakage of the first gate valve 8 and the pressure regulator 7 was not observed.

Comparative Example 1

The same operations as those in Example 1 were performed, except removing the buffer tank 9 and always bringing the second gate valve 10 into the closed state, and then the first fluorine gas-containing gas was supplied to the consumption equipment 20 while regulating the supply pressure to the consumption equipment 20 to 10% (1.4 MPa) of the gas pressure in the filled container 2. When a seat leakage test for the first gate valve 8 and the pressure regulator 7 was carried out in the same manner as in Example 1, the seat leakage of the pressure regulator 7 was observed.

Since no buffer tank 9 was provided, it is considered that a damage occurred in the pressure regulator 7 because the gas pressure in the filled container 2 was applied to the pressure regulator 7 without being substantially buffered.

REFERENCE SIGNS LIST 1 supply equipment
2 filled container
3 container valve
4 pipe
5 first pressure gauge
6 second pressure gauge
7 pressure regulator
8 first gate valve
9 buffer tank
10 second gate valve
11 third gate valve
12 fourth gate valve
13 fifth gate valve
14 sixth gate valve
15 inert gas supply source
16 second fluorine gas-containing gas supply source
17 vacuum pump
18 first branch pipe
18A, 18B, 18C branch pipe
19 second branch pipe
20 consumption equipment

The invention claimed is:

1. A method for supplying a fluorine gas-containing gas from supply equipment for supplying the fluorine gas-containing gas to consumption equipment consuming the fluorine gas-containing gas,
the supply equipment including a filled container filled with a first fluorine gas-containing gas, a pipe letting a container valve of the filled container and the consumption equipment communicate with each other, a pressure regulator provided on the pipe and passing the gas from an upstream side to a downstream side while regulating a gas pressure, and a buffer tank connected to a portion on an upstream side relative to the pressure regulator of the pipe,
the method comprising:
performing a sealing step of bringing the pressure regulator into a closed state, and then introducing a second fluorine gas-containing gas having a fluorine gas concentration in a range of ±10% of a fluorine gas concentration of the first fluorine gas-containing gas into a portion between the container valve and the pressure regulator of the pipe such that a pressure is lower than the gas pressure in the filled container, and
after the sealing step, in a state where the second fluorine gas-containing gas is sealed in the portion between the container valve and the pressure regulator of the pipe and after the buffer tank is brought into an opened state, introducing the first fluorine gas-containing gas from the filled container into the portion between the container valve and the pressure regulator of the pipe, sending the second fluorine gas-containing gas sealed in the portion between the container valve and the pressure regulator of the pipe to the buffer tank, and then supplying the first fluorine gas-containing gas introduced into the portion between the container valve and the pressure regulator of the pipe to the consumption equipment.

2. The method for supplying a fluorine gas-containing gas according to claim 1, wherein
the pressure of the second fluorine gas-containing gas is 45% or more and 54% or less of the gas pressure in the filled container.

3. The method for supplying a fluorine gas-containing gas according to claim 1, wherein
as the second fluorine gas-containing gas, a fluorine gas-containing gas having same pressure and fluorine gas concentration as the pressure and the fluorine gas concentration of the first fluorine gas-containing gas is used.

4. The method for supplying a fluorine gas-containing gas according to claim 1, wherein
a gate valve used in the supply equipment is a diaphragm valve.

5. The method for supplying a fluorine gas-containing gas according to claim 1 comprising:
before the sealing step, performing a purge treatment step of replacing the portion between the container valve and the pressure regulator of the pipe with an inert gas.

6. The method for supplying a fluorine gas-containing gas according to claim 1, wherein
a material of a seat as a constituent component of the pressure regulator is a polychlorotrifluoroethylene resin.

7. The method for supplying a fluorine gas-containing gas according to claim 1, wherein
the consumption equipment is a semiconductor manufacturing device.

8. The method for supplying a fluorine gas-containing gas according to claim 2, wherein
a gate valve used in the supply equipment is a diaphragm valve.

9. The method for supplying a fluorine gas-containing gas according to claim 3, wherein
a gate valve used in the supply equipment is a diaphragm valve.

10. The method for supplying a fluorine gas-containing gas according to claim 2 comprising:
before the sealing step, performing a purge treatment step of replacing the portion between the container valve and the pressure regulator of the pipe with an inert gas.

11. The method for supplying a fluorine gas-containing gas according to claim 3 comprising:
before the sealing step, performing a purge treatment step of replacing the portion between the container valve and the pressure regulator of the pipe with an inert gas.

12. The method for supplying a fluorine gas-containing gas according to claim 4 comprising:
before the sealing step, performing a purge treatment step of replacing the portion between the container valve and the pressure regulator of the pipe with an inert gas.

13. The method for supplying a fluorine gas-containing gas according to claim 2, wherein
a material of a seat as a constituent component of the pressure regulator is a polychlorotrifluoroethylene resin.

14. The method for supplying a fluorine gas-containing gas according to claim 3, wherein
a material of a seat as a constituent component of the pressure regulator is a polychlorotrifluoroethylene resin.

15. The method for supplying a fluorine gas-containing gas according to claim 4, wherein
a material of a seat as a constituent component of the pressure regulator is a polychlorotrifluoroethylene resin.

16. The method for supplying a fluorine gas-containing gas according to claim 5, wherein
a material of a seat as a constituent component of the pressure regulator is a polychlorotrifluoroethylene resin.

17. The method for supplying a fluorine gas-containing gas according to claim 2, wherein
the consumption equipment is a semiconductor manufacturing device.

18. The method for supplying a fluorine gas-containing gas according to claim 3, wherein
the consumption equipment is a semiconductor manufacturing device.

19. The method for supplying a fluorine gas-containing gas according to claim 4, wherein
the consumption equipment is a semiconductor manufacturing device.

* * * * *